(12) United States Patent
Kabishcer et al.

(10) Patent No.: US 11,615,063 B2
(45) Date of Patent: Mar. 28, 2023

(54) SIMILARITY DEDUPLICATION

(71) Applicant: EMC IP Holding Company LLC, Hopkinton, MA (US)

(72) Inventors: Alexei Kabishcer, Ramat Gan (IL); Uri Shabi, Tel Mond (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 149 days.

(21) Appl. No.: 17/155,224

(22) Filed: Jan. 22, 2021

(65) Prior Publication Data

US 2022/0237155 A1   Jul. 28, 2022

(51) Int. Cl.
   *G06F 16/00*   (2019.01)
   *G06F 16/215*   (2019.01)
   *G06F 16/22*   (2019.01)
   *H03M 7/30*   (2006.01)

(52) U.S. Cl.
   CPC ........ *G06F 16/215* (2019.01); *G06F 16/2255* (2019.01); *H03M 7/3088* (2013.01)

(58) Field of Classification Search
   CPC .............. G06F 16/1748; G06F 16/215; G06F 16/2255; G06F 3/0608; G06F 3/0641; G06F 3/0683; H03M 7/3088
   See application file for complete search history.

(56) References Cited

U.S. PATENT DOCUMENTS

| | | | |
|---|---|---|---|
| 7,970,216 B2* | 6/2011 | Bashyam | H04N 19/17 382/233 |
| 9,367,557 B1* | 6/2016 | Lin | G06F 16/1744 |
| 9,411,815 B1* | 8/2016 | Lu | G06F 11/1453 |
| 10,216,754 B1* | 2/2019 | Douglis | G06F 16/1744 |
| 10,509,676 B1 | 12/2019 | Bassov et al. | |
| 2007/0250670 A1 | 10/2007 | Fineberg et al. | |
| 2014/0070966 A1* | 3/2014 | Fablet | H03M 7/3086 341/55 |
| 2017/0038978 A1 | 2/2017 | Li et al. | |

OTHER PUBLICATIONS

Wikipedia, "MinHash," https://en.wikipedia.org/wiki/MinHash.
European Patent Office, International Search Report and Written Opinion dated Oct. 7, 2021.

* cited by examiner

*Primary Examiner* — Diedra McQuitery
(74) *Attorney, Agent, or Firm* — Muirhead and Saturnelli, LLC

(57) ABSTRACT

Dictionary-based compression is performed to compress data units using a similar data unit as the base unit (i.e., dictionary) for each candidate data unit. Similarity may be determined between data units by applying a locality-sensitive hashing scheme to each candidate data unit to produce a hash value, and by determining whether there is a matching value in a hash index of hash values for existing data units on the system. If there is a matching hash value, the candidate data unit may be compressed using the data unit corresponding to the matching hash value as the dictionary. Only a representative portion of the data unit may be hashed to produce the hash value, the portion comprised of chunks of the data unit, where each chunk is a continuous, uninterrupted section of data. The chunks themselves may not be (in some embodiments likely are not) contiguous to one another.

21 Claims, 6 Drawing Sheets

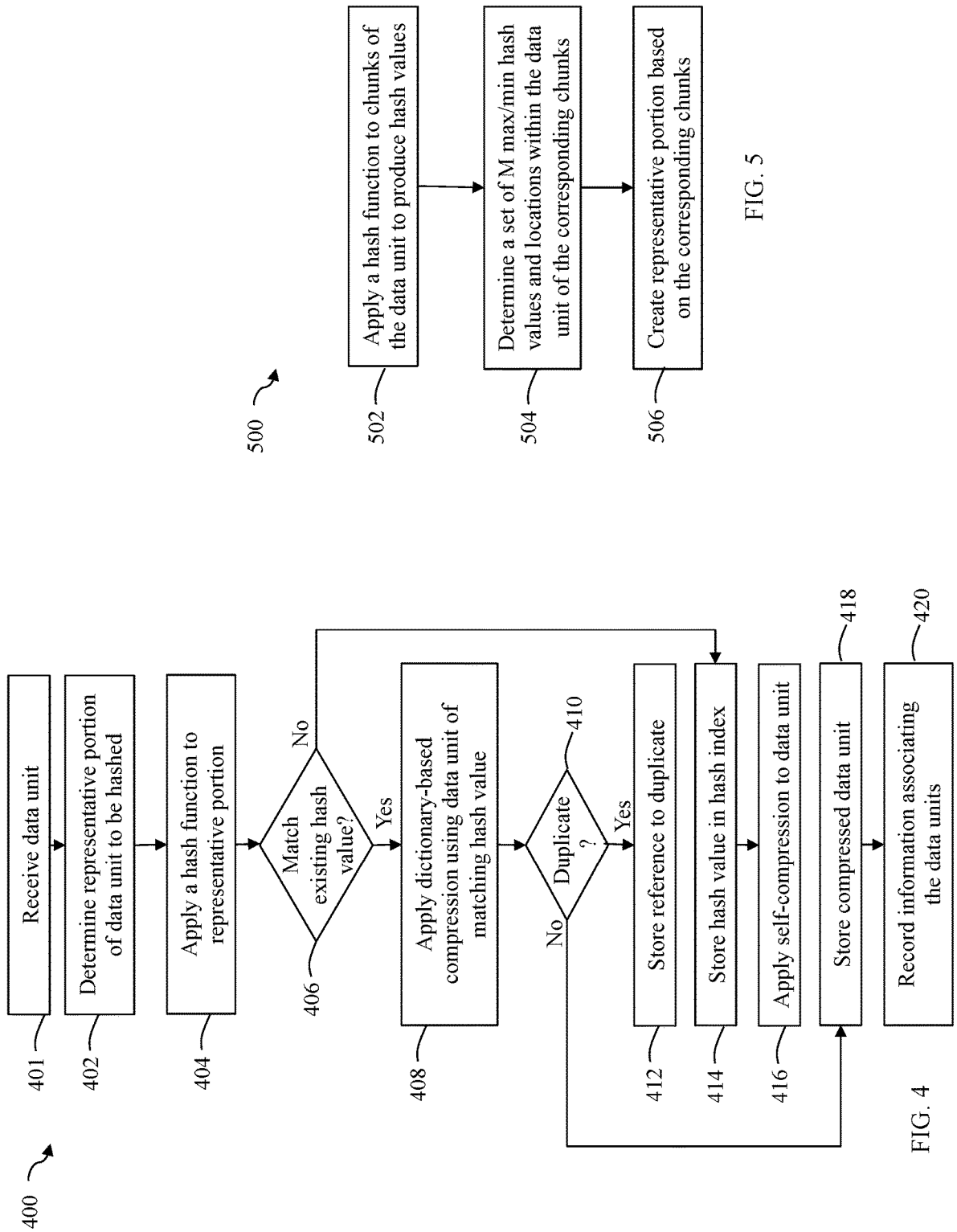

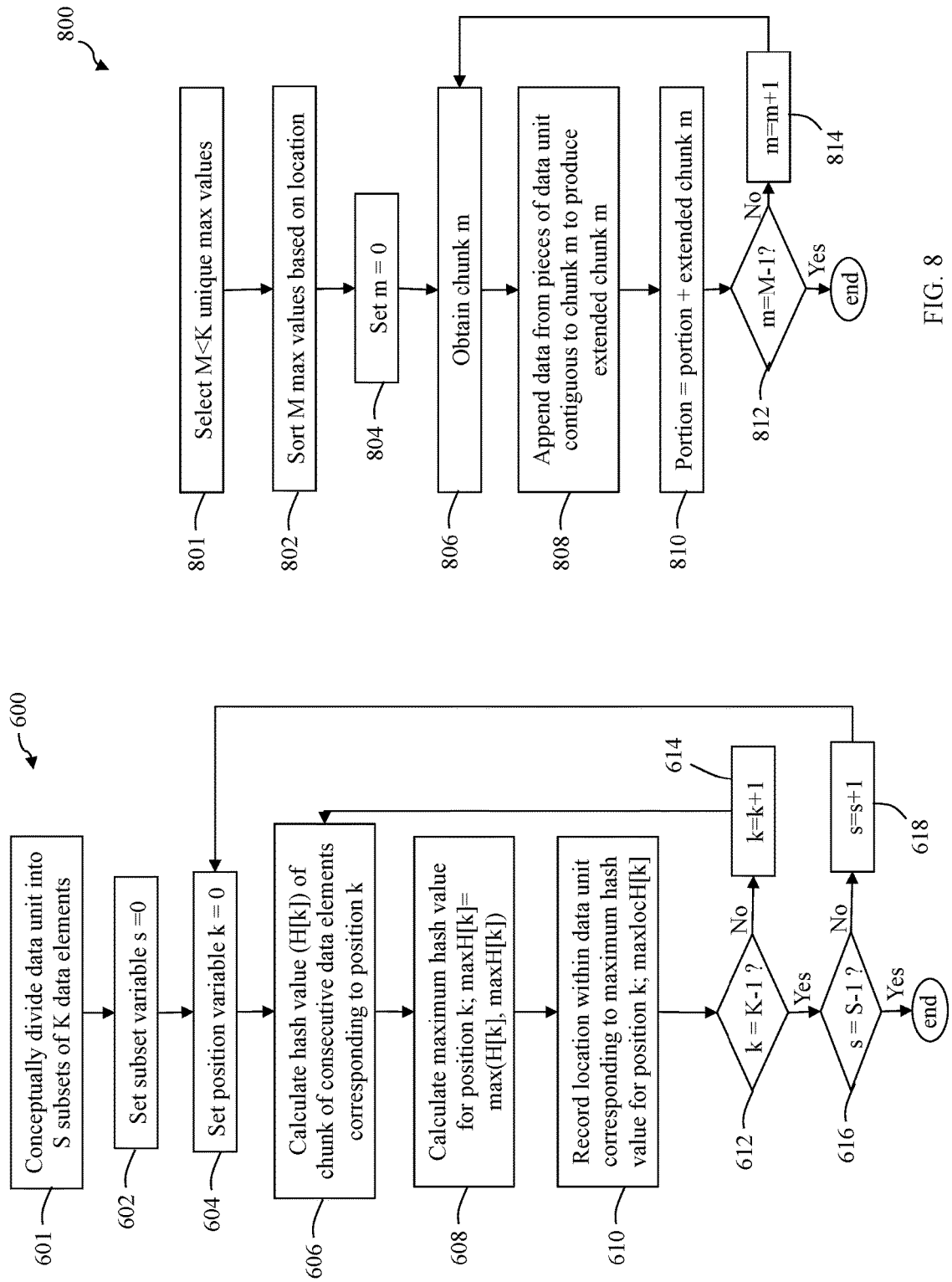

SIMILARITY DEDUPLICATION

BACKGROUND

Technical Field

This application generally relates to data reduction, in particular similarity deduplication on data storage systems.

Description of Related Art

Systems may include different resources used by one or more host processors. The resources and the host processors in the system may be interconnected by one or more communication connections, such as network connections. These resources may include data storage devices such as those included in data storage systems. The data storage systems may be coupled to one or more host processors and provide storage services to each host processor. Multiple data storage systems from one or more different vendors may be connected and may provide common data storage for the one or more host processors.

A host may perform a variety of data processing tasks and operations using the data storage system. For example, a host may issue I/O operations, such as data read and write operations, received at a data storage system. The host systems may store and retrieve data by issuing the I/O operations to the data storage system containing a plurality of host interface units, disk drives (or more generally storage devices), and disk interface units. The host systems access the storage devices through a plurality of channels provided therewith. The host systems provide data and access control information through the channels to a storage device of the data storage system. Data stored on the storage device may also be provided from the data storage system to the host systems also through the channels. The host systems do not address the storage devices of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In some embodiments of the invention, a method is provided for a data storage system having a plurality of physical storage devices on which data units are stored. The method includes: applying a first hash function to a first data unit to produce a first hash value of a first data unit; determining whether the first hash value has a same hash value as any of one or more other data units; compressing the data unit to produce a compressed data unit, may include, if the first hash value has a same hash value as a second data unit of the one or more other data units, compressing the first data unit using dictionary-based compression, wherein the second data unit is applied as a dictionary; and storing the compressed data unit on one or more of the plurality of physical storage devices. The first hash function may be applied to only a portion of the first data unit to produce the first hash value. The method further may include: applying a second hash function to a plurality of chunks of the first data unit to produce, for each of the plurality of chunks, a third hash value; determining a plurality of maximum values or minimum values from among the third hash values; forming the portion of the first data unit from at least a subset of the chunks that produced the maximum values or minimum values. The method further may include, for each chunk of the subset of chunks, appending other contiguous pieces of data from before and/or after the chunk within the data unit to the chunk to produce an extended chunk, where the portion of the data may be formed from the extended chunks. The method further may include: recording a relative position within the first data unit of each chunk that produced one of the plurality of maximum and minimum values; and, for the at least subset of chunks, obtaining the chunk from the recorded relative position of the chunk. The method further may include ordering the at least subset of chunks according to the relative positions of the chunks within the first data unit, where forming the portion includes concatenating the chunks according to the ordering. If the first hash value does not have a same hash value as any data unit of the one or more other data units, the first data unit may be compressed using self-compression to produce the compressed data unit, and the method further may include storing the first hash value in a hash index.

In other embodiments of the invention, a data storage system includes a plurality of physical storage devices on which data units are stored, and executable logic that implements a method. The methods includes: applying a first hash function to a first data unit to produce a first hash value of a first data unit; determining whether the first hash value has a same hash value as any of one or more other data units; compressing the data unit to produce a compressed data unit, including, if the first hash value has a same hash value as a second data unit of the one or more other data units, compressing the first data unit using dictionary-based compression, wherein the second data unit is applied as a dictionary; and storing the compressed data unit on one or more of the plurality of physical storage devices. The first hash function may be applied to only a portion of the first data unit to produce the first hash value. The method further may include: applying a second hash function to a plurality of chunks of the first data unit to produce, for each of the plurality of chunks, a third hash value; determining a plurality of maximum values or minimum values from among the third hash values; and forming the portion of the first data unit from at least a subset of the chunks that produced the maximum values or minimum values. The method further may include, for each chunk of the subset of chunks, appending other contiguous pieces of data from before and/or after the chunk within the data unit to the chunk to produce an extended chunk, where the portion of the data may be formed from the extended chunks. The method further may include recording a relative position within the first data unit of each chunk that produced one of the plurality of maximum and minimum values, and, for the at least subset of chunks, obtaining the chunk from the recorded relative position of the chunk. The method further may include ordering the at least subset of chunks according to the relative positions of the chunks within the first data unit, where forming the portion may include concatenating the chunks according to the ordering. If the first hash value does not have a same hash value as any data unit of the one or more other data units, the first data unit is compressed using self-compression to produce the compressed data unit, and the method further may include storing the first hash value in a hash index.

In other embodiments of the invention, for a data storage system having a plurality of physical storage devices on which data units are stored, computer-readable media having software stored thereon is provided. The software includes: executable code that applies a first hash function to a first data unit to produce a first hash value of a first data unit; executable code that determines whether the first hash value has a same hash value as any of one or more other data units; executable code that compresses the data unit to produce a compressed data unit, including, if the first hash value has a same hash value as a second data unit of the one or more other data units, compressing the first data unit using dictionary-based compression, wherein the second data unit is applied as a dictionary; and executable code that stores the compressed data unit on one or more of the plurality of physical storage devices. The first hash function may be applied to only a portion of the first data unit to produce the first hash value. The computer-readable media further may include: executable code that applies a second hash function to a plurality of chunks of the first data unit to produce, for each of the plurality of chunks, a third hash value; executable code that determines a plurality of maximum values or minimum values from among the third hash values; and executable code that forms the portion of the first data unit from at least a subset of the chunks that produced the maximum values or minimum values. The computer-readable media further may include executable code that, for each chunk of the subset of chunks, appends other contiguous pieces of data from before and/or after the chunk within the data unit to the chunk to produce an extended chunk, where the portion of the data may be formed from the extended chunks. The computer-readable media further may include: executable code that records a relative position within the first data unit of each chunk that produced one of the plurality of maximum and minimum values; and executable code that, for the at least subset of chunks, obtains the chunk from the recorded relative position of the chunk. If the first hash value does not have a same hash value as any data unit of the one or more other data units, the first data unit is compressed using self-compression to produce the compressed data unit, and the computer-readable media further may include executable code that stores the first hash value in a hash index.

BRIEF DESCRIPTION OF THE DRAWINGS

Features and advantages of the present invention will become more apparent from the following detailed description of exemplary embodiments thereof taken in conjunction with the accompanying drawings in which:

FIG. 4 is a flow chart illustrating an example of a method of compressing a data unit, according to embodiments of the invention;

FIG. 5 is a flow chart illustrating an example of a method of determining a representative portion of a data unit to be hashed, according to embodiments of the invention;

FIG. 6 is a flow chart illustrating an example of a method of applying a hash function to chunks of a data unit to determine max/min hash values for the data unit, according to embodiments of the invention;

FIG. 8 is a flow chart illustrating an example of a method of creating a representative portion of a data unit to be hashed from chunks of the data unit, according to embodiments of the invention.

DETAILED DESCRIPTION OF EMBODIMENTS

Figure 1:
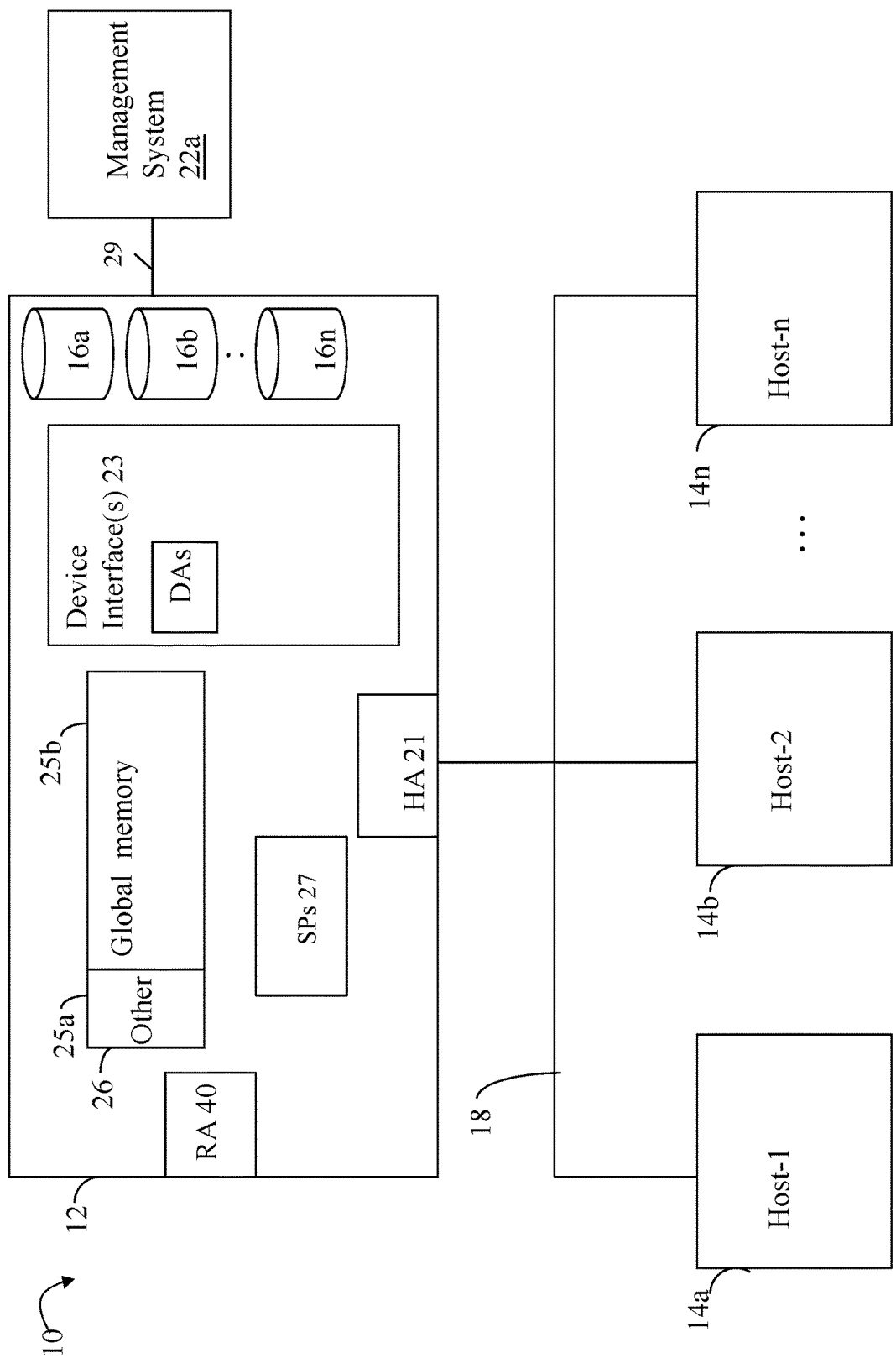
FIG. 1 is an example of components that may be included in a system in accordance with the techniques described herein.

Effective data reduction is one of the most important capabilities of data storage systems today, and can improve the capacity of the storage system. Data reduction may include many techniques, where deduplication and compression are two of the most well-known. Compression enables reduction of repeated symbols, whereas deduplication is essentially the removal of identical duplicated pages.

Similarity reduction is an emerging data reduction technique, which combines elements of compression and deduplication. Similarity reduction includes identifying two or more data units (e.g., pages, files, blocks of data storage, etc.) that are similar. The one or more data units includes a base data unit that is used as a dictionary to perform dictionary-based compression of other data units of the two or more similar data units, which may be referred to as candidate pages. A "dictionary" in this context is a unit of data against which other units of data are compared to perform the compression. That is, rather than compressing a unit of data—e.g., a page, file or block of data storage—based on the contents of the data unit itself, which may be referred to herein as "self-compression," a data unit may be compared to a designated data unit—the dictionary. Compression using dictionaries has been demonstrated to achieve significant improvements in both the compression ratio as well as compression and decompression time. Determining similarity between data units, and performing dictionary-based compression between the similar data units may be referred to herein collectively as "similarity deduplication," or performing "similarity dedupe." Various compression algorithms may be used to perform dictionary-based compression, including, for example, gzip or zstandard.

A primary aspect of implementing similarity deduplication is determining if data units are similar, which may be done by implementing a hashing scheme involving the use of one or more hash functions, including ultimately applying a hash function to each data unit to produce a hash value that is compared to hash values previously determined for existing data units of a dataset. Determining the appropriate hashing scheme to be applied to determine similarity between data units is a hard problem, depending on many factors, including, among other factors: the computational resources available and required, memory resources available and required and/or networking resources available and required; the size and number of data units of the dataset being compressed; the size of the hash values to be generated and compared, desired characteristics (i.e., properties) of the ultimate resulting hash value, including, e.g., the extent of false positives, true positives, false negatives and/or true negatives; desired speed of compression; and the desired (e.g., average) data reduction ratio. The hashing scheme may be a locality-sensitive hashing (LSH) scheme, the application of which to data units should produce similar, or even the same, hash values for similar data units.

In some embodiments, an LSH scheme may be chosen that produces similar (but not necessarily the same) hash values for similar data units, where such an LSH scheme may be referred to herein as a "similarity scheme." When using a similarity scheme, clustering techniques may be employed to create clusters of similar hash values generated from data units (e.g., where the similarity is based on Euclidian/Manhattan distance, e.g., Hamming distance); and, for each cluster, a data unit may be chosen to serve as the dictionary for the cluster for dictionary-based compression of any data units within the cluster.

In other embodiments, to avoid the additional resources required to implement clustering, an LSH scheme may be chosen that produces the same hash value for similar data units—i.e., exact matches between hash values for similar data units—where such an LSH scheme may be referred to herein as an "exact scheme." However, such exact schemes may require relatively extensive computation resources in order to achieve the desired accuracy—i.e., exact matches for data units having a certain degree of similarity.

What may be desirable is a data compression technique that employs an exact scheme that, in addition to avoiding the need to employ clustering, also is computationally efficient relative to known solutions while also providing desired accuracy.

Described herein are techniques and mechanisms for compressing data units in which dictionary-based compression is performed using a similar data unit as the base unit for each candidate data unit. Similarity may be determined between data units by applying an LSH scheme, for example, an exact scheme, to each candidate data unit to produce a hash value, and by determining whether there is a matching value in a hash index of hash values for existing data units on the system. If there is a matching hash value, the candidate data unit may be compressed using the data unit (i.e., the base data unit) corresponding to the matching hash value.

In some embodiments, only a portion of a data unit is hashed to produce the hash value, and it may be determined what portion of the data unit is to be hashed. As used herein, a data unit or portion thereof is "hashed" if it has a hashing function applied thereto. Such a portion may be referred to herein as a "representative portion" of a data unit. In some embodiments, the representative portion may be significant smaller, perhaps orders or magnitude smaller, than the data unit. By hashing only a portion of the data unit, computational resources may be conserved. The LSH scheme should be configured so that the determined representative portion is likely to yield accurate hash-matching results with hash values generated from similar data units—e.g., a low percentage of false positives and a high percentage of true positives.

The representative portion of a data unit to be hashed may be comprised of a plurality of chunks of data of the data unit, where each chunk is a continuous, uninterrupted section of data (e.g., data from a logical block address (LBA) range). However, the chunks are not necessarily themselves contiguous to one another, although it is possible. In some embodiments, it is very unlikely that any two of the chunks of the set are contiguous to one another, for reasons that should be clear from the discussion herein. The chunks may be selected using a variation of the min-wise independent permutations LSH scheme (i.e., "MinHash"), for example, as described as of the date of this filing at: https://en.wikipedia.org/wiki/MinHash, the entire contents of which are hereby incorporated by reference.

A hash function, for example, a simple prime multiplication hash function, may be applied to chunks of the data unit, and a set of minimum or maximum resulting hash values ("max/min hash values") may be determined, as described in more details elsewhere herein. For each max/min hash value, the location within the data unit of the corresponding chunk that produced the max/min hash value may be recorded, and the representative portion of the data unit may be created from these corresponding chunks. In some embodiments, for each corresponding chunk, additional pieces (i.e., chunks) of data contiguous (e.g., before and/or after) the corresponding chunk may be concatenated to the corresponding chunk to produce an extended chunk, as is described in more detail elsewhere herein. The extended chunks may be concatenated together to form the representative portion of the data unit.

A hash function (e.g., xxHash or any of a variety of other hash functions) may be applied to the representative portion to produce a hash value for the data unit. It may be determined whether the hash value matches any existing hash values for a dataset (e.g., a logical volume or storage group to name just a few), for example, by accessing a hash value index for the dataset. If it is determined that there is no matching hash value, the data unit may be compressed using self-compression, and the hash value generated from the representative portion of the data portion added to the hash value index.

If a matching hash value is determined, dictionary compression may be performed on the data unit (the candidate data unit) using the data unit corresponding to the matching hash value (the base data unit) as the dictionary. That is, two data units that have the exact same representative portions (i.e., all the same bit values at the locations of the chunks (e.g., extended chunks) that constitute the representative portion) will generate the same hash value and be deemed at least similar. In the event that the comparing of the data of the two data units as part of dictionary-based compression reveals that the two data units are identical, rather than compressing the candidate data unit and storing a compressed version of the candidate data unit, a reference (e.g., ID and/or location) to the base data unit may be stored. If the two data units are not identical, the compressed candidate data unit resulting from the dictionary-based compression may be stored. Information associating the compressed candidate data unit and the base data unit may be stored so that the base data unit may be used to decompress the compressed candidate data unit as needed, for example, is response to a read request. For example, a reference (e.g., ID and/or location) to the base data unit may be associated with a reference (e.g., ID and/or location) of the compressed candidate data unit and/or stored with the compressed candidate data unit itself.

Illustrative embodiments of the invention will now be described in more detail in relation to the figures.

Referring to the FIG. 1, shown is an example of an embodiment of a system 10 that may be used in connection with performing the techniques described herein. The system 10 includes a data storage system 12 connected to the host systems (also sometimes referred to as hosts) 14a-14n through the communication medium 18. In this embodiment of the system 10, the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host systems 14a-14n and data storage system 12 may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the hosts 14a-14n and the data storage system 12 may all be located at the same physical site, or, alternatively, may also be located in different physical locations. The communication medium 18 used for communication between the host systems 14a-14n and the data storage system 12 of the system 10 may use a variety of different communication protocols such as block-based protocols (e.g., SCSI, Fibre Channel, iSCSI), file system-based protocols (e.g., NFS or network file server), and the like. Some or all of the connections by which the hosts 14a-14n and the data storage system 12 may be connected to the communication medium 18 may pass through other communication devices, such as switching equipment, a phone line, a repeater, a multiplexer or even a satellite.

Each of the host systems 14a-14n may perform data operations. In the embodiment of the FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although the element 12 is illustrated as a single data storage system, such as a single data storage array, the element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrating the techniques herein, reference may be made to a single data storage array by a vendor. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of physical data storage devices (PDs) 16a-16n. The PDs 16a-16n may include one or more types of physical data storage devices such as, for example, one or more rotating disk drives and/or one or more solid state drives (SSDs). An SSD is a data storage device that uses solid-state memory to store persistent data. SSDs may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include, for example, one or more SLC (single-level cell) devices and/or MLC (multi-level cell) devices.

The data storage array may also include different types of adapters or directors, such as an HA 21 (host adapter), RA 40 (remote adapter), and/or device interface(s) 23. Each of the adapters may be implemented using hardware including a processor with a local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from one of the hosts 14a-n. The data storage array may include one or more RAs that may be used, for example, to facilitate communications between data storage arrays. The data storage array may also include one or more device interfaces 23 for facilitating data transfers to/from the PDs 16a-16n. The data storage device interfaces 23 may include device interface modules, for example, one or more disk adapters (DAs) (e.g., disk controllers) for interfacing with the flash drives or other PDs (e.g., PDs 16a-n). The DAs may also be characterized as back end components of the data storage system which interface with the PDs.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, the HAs and/or the RAs in a data storage array. In one embodiment, the device interfaces 23 may perform data operations using a system cache that may be included in the global memory 25b, for example, when communicating with other device interfaces and other components of the data storage array. The other portion 25a is that portion of the memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

The host systems 14a-14n provide data and access control information through channels to the storage systems 12, and the storage systems 12 may also provide data to the host systems 14a-n also through the channels. The host systems 14a-n do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of storage space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or, more generally, PDs. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may include one or more type of device interface used in connection with facilitating data transfers to/from the associated disk drive(s) and LUN (s) residing thereon. For example, such device interfaces may include a device interface used in connection with facilitating data transfers to/from the associated flash devices and LUN(s) residing thereon. It should be noted that an embodiment may use the same or a different device interface for one or more different types of devices than as described herein.

In an embodiment in accordance with the techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of the techniques herein may be made with respect to a physical data storage system and its physical components (e.g., physical hardware for each HA, DA, HA port and the like), the techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in the FIG. 1 is a management system 22*a* that may be used to manage and monitor the data storage system 12. In one embodiment, the management system 22*a* may be a computer system which includes data storage system management software or application such as may execute in a web browser. A data storage system manager may, for example, view information about a current data storage configuration such as LUNs, storage pools, and the like, on a user interface (UI) in a display device of the management system 22*a*. Alternatively, and more generally, the management software may execute on any suitable processor in any suitable system. For example, the data storage system management software may execute on a processor of the data storage system 12.

Information regarding the data storage system configuration may be stored in any suitable data container, such as a database. The data storage system configuration information stored in the database may generally describe the various physical and logical entities in the current data storage system configuration. The data storage system configuration information may describe, for example, the LUNs configured in the system, properties and status information of the configured LUNs (e.g., LUN storage capacity, unused or available storage capacity of a LUN, consumed or used capacity of a LUN), configured RAID groups, properties and status information of the configured RAID groups (e.g., the RAID level of a RAID group, the particular PDs that are members of the configured RAID group), the PDs in the system, properties and status information about the PDs in the system, local replication configurations and details of existing local replicas (e.g., a schedule or other trigger conditions of when a snapshot is taken of one or more LUNs, identify information regarding existing snapshots for a particular LUN), remote replication configurations (e.g., for a particular LUN on the local data storage system, identify the LUN's corresponding remote counterpart LUN and the remote data storage system on which the remote LUN is located), data storage system performance information such as regarding various storage objects and other entities in the system, and the like.

Consistent with other discussion herein, management commands issued over the control or data path may include commands that query or read selected portions of the data storage system configuration, such as information regarding the properties or attributes of one or more LUNs. The management commands may also include commands that write, update, or modify the data storage system configuration, such as, for example, to create or provision a new LUN (e.g., which may result in modifying one or more database tables such as to add information for the new LUN), to modify an existing replication schedule or configuration (e.g., which may result in updating existing information in one or more database tables for the current replication schedule or configuration), to delete a LUN (e.g., which may include deleting the LUN from a table of defined LUNs and may also include modifying one or more other database tables to delete any existing snapshots of the LUN being deleted), and the like.

It should be noted that each of the different adapters, such as each HA, DA, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16*a*-16*n*. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of the FIG. 1 may be a data storage system, such as a data storage array, that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, the memory 26 may represent memory of each such storage processor.

Generally, the techniques herein may be used in connection with any suitable storage system, appliance, device, and the like, in which data is stored. For example, an embodiment may implement the techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receive a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to the FIG. 1, the control commands may be issued from data storage management software executing on management system 22a to the data storage system 12. Such commands may be, for example, to establish or modify data services, provision storage, perform user account management, and the like. Consistent with other discussion herein, the management commands may result in processing that includes reading and/or modifying information in the database storing data storage system configuration information. For example, management commands that read and/or modify the data storage system configuration information in the database may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to the FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

Figure 2:
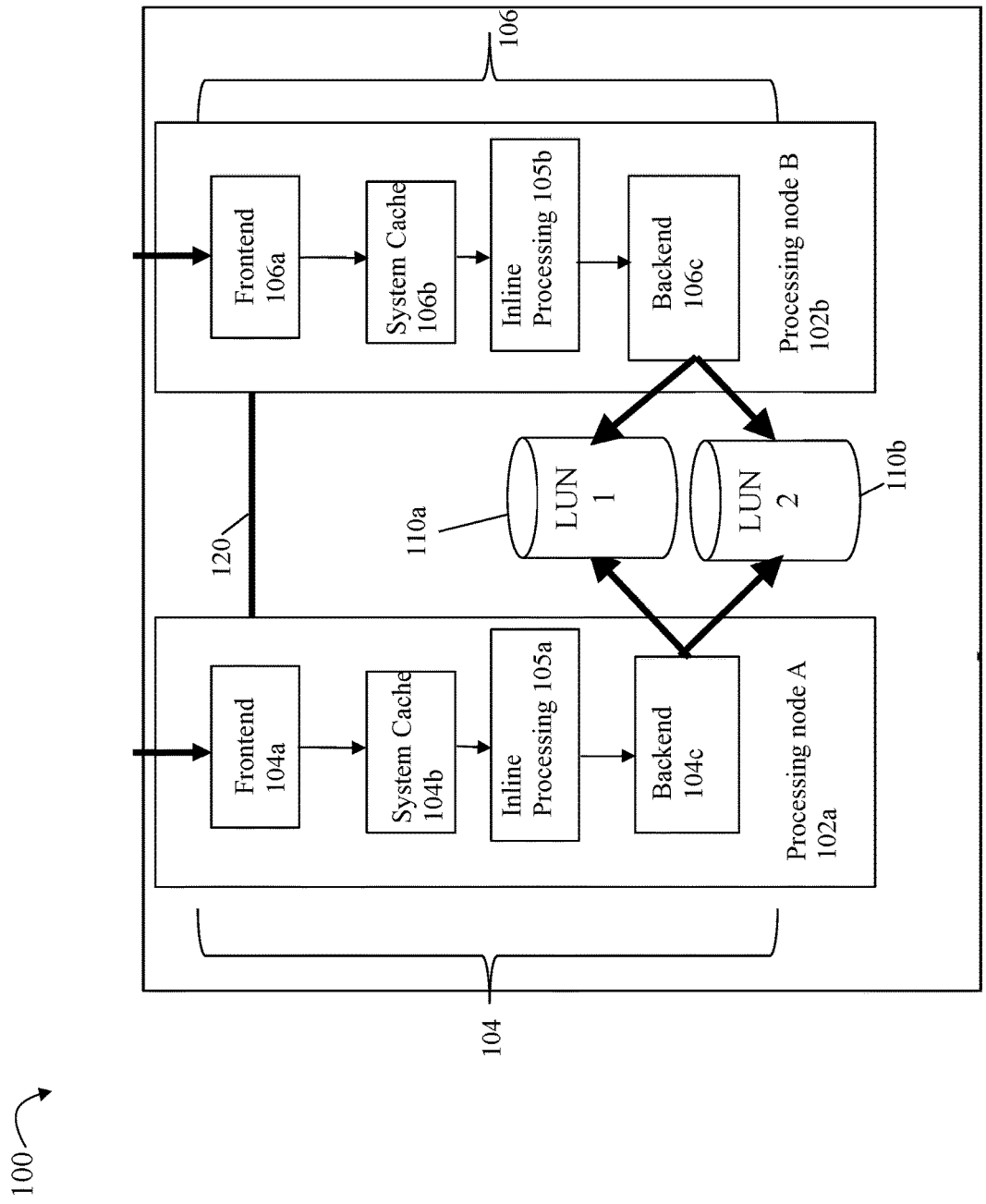
FIG. 2 is an example illustrating the I/O path or data path in connection with processing data in an embodiment in accordance with the techniques herein.

With reference to the FIG. 2, shown is an example 100 illustrating components that may be included in the data path in at least one existing data storage system in accordance with the techniques herein. The example 100 includes two processing nodes A 102a and B 102b and the associated software stacks 104, 106 of the data path, where I/O requests may be received by either processing node 102a or 102b. In the example 200, the data path 104 of processing node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and non-volatile physical storage (e.g., back-end physical non-volatile storage devices or PDs accessed by BE components such as DAs as described herein). During movement of data in and out of the system cache layer 104b (e.g., such as in connection with read data from, and writing data to, physical storage 110a, 110b), inline processing may be performed by layer 105a. Such inline processing operations of 105a may be optionally performed and may include any one of more data processing operations in connection with data that is flushed from system cache layer 104b to the back-end non-volatile physical storage 110a, 110b, as well as when retrieving data from the back-end non-volatile physical storage 110a, 110b to be stored in the system cache layer 104b. In at least one embodiment, the inline processing may include, for example, performing one or more data reduction operations such as data duplication or data compression. The inline processing may include performing any suitable or desirable data processing operations as part of the I/O or data path.

In a manner similar to that as described for data path 104, the data path 106 for processing node B 102b has its own FE component 106a, system cache layer 106b, inline processing layer 105b, and BE component 106c that are respectively similar to the components 104a, 104b, 105a and 104c. The elements 110a, 110b denote the non-volatile BE physical storage provisioned from PDs for the LUNs, whereby an I/O may be directed to a location or logical address of a LUN and where data may be read from, or written to, the logical address. The LUNs 110a, 110b are examples of storage objects representing logical storage entities included in an existing data storage system configuration. Since, in this example, writes directed to the LUNs 110a, 110b may be received for processing by either of the nodes 102a and 102b, the example 100 illustrates what may also be referred to as an active-active configuration.

In connection with a write operation as may be received from a host and processed by the processing node A 102a, the write data may be written to the system cache 104b, marked as write pending (WP) denoting it needs to be written to the physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned to the host (e.g., by component the 104a). At various points in time, the WP data stored in the system cache is flushed or written out to the physical storage 110a, 110b.

In connection with the inline processing layer 105a, prior to storing the original data on the physical storage 110a, 110b, one or more data reduction operations may be performed. For example, the inline processing may include performing data compression processing, data deduplication processing, and the like, that may convert the original data (as stored in the system cache prior to inline processing) to a resulting representation or form which is then written to the physical storage 110a, 110b.

In connection with a read operation to read a block of data, a determination is made as to whether the requested read data block is stored in its original form (in system cache 104b or on physical storage 110a, 110b), or whether the requested read data block is stored in a different modified form or representation. If the requested read data block (which is stored in its original form) is in the system cache, the read data block is retrieved from the system cache 104b and returned to the host. Otherwise, if the requested read data block is not in the system cache 104b but is stored on the physical storage 110a, 110b in its original form, the requested data block is read by the BE component 104c from the backend storage 110a, 110b, stored in the system cache and then returned to the host.

If the requested read data block is not stored in its original form, the original form of the read data block is recreated and stored in the system cache in its original form so that it can be returned to the host. Thus, requested read data stored on physical storage 110a, 110b may be stored in a modified form where processing is performed by 105a to restore or convert the modified form of the data to its original data form prior to returning the requested read data to the host.

Also illustrated in FIG. 2 is an internal network interconnect 120 between the nodes 102a, 102b. In at least one embodiment, the interconnect 120 may be used for internode communication between the nodes 102a, 102b.

In connection with at least one embodiment in accordance with the techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. The processor cache may be substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage. For example, in at least one embodiment, a RAM based memory may be one of the caching layers used as to cache the write data that is then flushed to the backend physical storage. When the processor performs processing, such as in connection with the inline processing 105a, 105b as noted above, data may be loaded from the main memory and/or other lower cache levels into its CPU cache.

In at least one embodiment, the data storage system may be configured to include one or more pairs of nodes, where each pair of nodes may be generally as described and represented as the nodes 102a-b in the FIG. 2. For example, a data storage system may be configured to include at least one pair of nodes and at most a maximum number of node pairs, such as for example, a maximum of 4 node pairs. The maximum number of node pairs may vary with embodiment. In at least one embodiment, a base enclosure may include the minimum single pair of nodes and up to a specified maximum number of PDs. In some embodiments, a single base enclosure may be scaled up to have additional BE non-volatile storage using one or more expansion enclosures, where each expansion enclosure may include a number of additional PDs. Further, in some embodiments, multiple base enclosures may be grouped together in a load-balancing cluster to provide up to the maximum number of node pairs. Consistent with other discussion herein, each node may include one or more processors and memory. In at least one embodiment, each node may include two multi-core processors with each processor of the node having a core count of between 8 and 28 cores. In at least one embodiment, the PDs may all be non-volatile SSDs, such as flash-based storage devices and storage class memory (SCM) devices. It should be noted that the two nodes configured as a pair may also sometimes be referred to as peer nodes. For example, the node A 102a is the peer node of the node B 102b, and the node B 102b is the peer node of the node A 102a.

In at least one embodiment, the data storage system may be configured to provide both block and file storage services with a system software stack that includes an operating system running directly on the processors of the nodes of the system.

In at least one embodiment, the data storage system may be configured to provide block-only storage services (e.g., no file storage services). A hypervisor may be installed on each of the nodes to provide a virtualized environment of virtual machines (VMs). The system software stack may execute in the virtualized environment deployed on the hypervisor. The system software stack (sometimes referred to as the software stack or stack) may include an operating system running in the context of a VM of the virtualized environment. Additional software components may be included in the system software stack and may also execute in the context of a VM of the virtualized environment.

In at least one embodiment, each pair of nodes may be configured in an active-active configuration as described elsewhere herein, such as in connection with FIG. 2, where each node of the pair has access to the same PDs providing BE storage for high availability. With the active-active configuration of each pair of nodes, both nodes of the pair process I/O operations or commands and also transfer data to and from the BE PDs attached to the pair. In at least one embodiment, BE PDs attached to one pair of nodes may not be shared with other pairs of nodes. A host may access data stored on a BE PD through the node pair associated with or attached to the PD.

In at least one embodiment, each pair of nodes provides a dual node architecture where both nodes of the pair may be identical in terms of hardware and software for redundancy and high availability. Consistent with other discussion herein, each node of a pair may perform processing of the different components (e.g., FA, DA, and the like) in the data path or I/O path as well as the control or management path.

In some embodiments, the system 10 and/or the example 100 may be configured to perform data reduction, for example, similarity deduplication.

Figure 3:
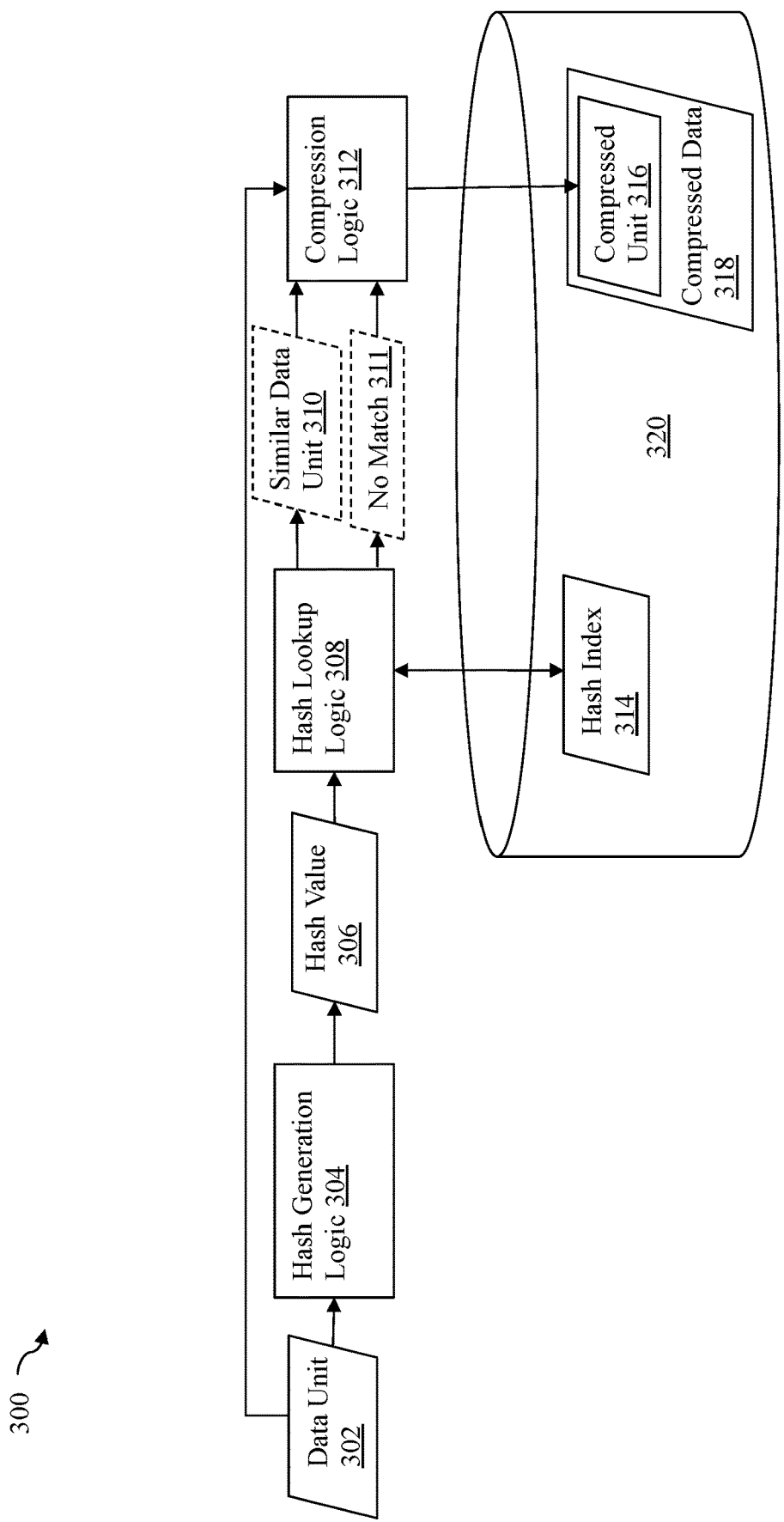
FIG. 3 is a data flow diagram illustrating an example of a system for compressing a data unit, according to embodiments of the invention.

FIG. 3 is a data flow diagram illustrating an example of a system 300 for compressing a data unit, according to embodiments of the invention. Other embodiments of a system for compressing a data unit, for example, variations of the system 300, are possible and are intended to fall within the scope of the invention. The system 300 may be implemented as part of the system 10 and/or example 100. The system 300 may be configured to perform similarity deduplication, and may be configured to perform methods 400, 500, 600 and/or 800 described in relation to FIGS. 4-8, respectively.

The system 300 may include any of: hash generation logic 304; hash lookup logic 308; compression logic 312; and data storage 320 on which hash index 314 and compressed data 318 may be stored. The hash index 314 may include a plurality of entries, where each entry includes a hash value generated from a data unit, an ID and/or location (direct or indirect) of the data unit that generated the hash value of the entry, and perhaps other information.

The hash generation logic 304 may be configured to receive a data unit 302 and generate a hash value 306 for the data unit, for example, as described in more detail elsewhere herein. The hash lookup logic 308 may be configured to receive the hash value 306, and to access the hash index 314 to determine if there is a matching hash value for an existing data unit. If the hash lookup logic 308 finds a matching hash value, it may send an ID and/or location of the similar data unit 310 corresponding to the matching hash value to the compression logic 312. If the hash lookup logic 308 does not find a matching hash value, it may send an indication of no match 311 to the compression logic 312.

The compression logic 312 may be configured to receive the data unit 302 and either an indication of no match 311 or the ID and/or location of the similar data unit 310. The compression logic may be configured such that, if an indication of no match 311 is received, the compression logic may perform self-compression on the data unit 302 to produce the compressed unit 316 to be stored among the compressed data 318. The compression logic 312 may be configured such that, if the ID and/or location of a similar data 310 is received, the compression logic 312 may perform dictionary-based compression on the data unit 302 using the similar data unit 310 as the dictionary to produce the compressed unit 316 to be stored among the compressed data 318. In some embodiments, the compression logic 312 may determine that the data unit 302 and the similar data unit are identical (i.e., duplicates), in which case it may halt compression of the data unit 302 and store a reference to the similar (in fact identical) data unit 310 for the data unit 320 instead of compressing it.

FIG. 4 is a flow chart illustrating an example of a method 400 of compressing a data unit, according to embodiments of the invention. Other embodiments of a method of compressing a data unit, for example, variations of the method 400, are possible and are intended to fall within the scope of the invention.

In a step 401, a data unit may be received, for example, as part of a write operation received at a storage system from a host system. In a step 402, a representative data portion of the data unit may be determined, for example, as described in more details elsewhere herein. In some embodiments, the step 402 is implemented by performance of a method 500 described in relation to FIG. 5.

In a step 404, a hash function may be applied to the representative portion to produce a hash value. The hash function may be any of a variety of hash functions, for example, xxHash. The steps 402 and/or 404 may be implemented by the hash generation logic 304.

In a step 406, it may be determined whether the determined hash value matches any hash value for an existing data unit of the dataset, for example, by accessing the hash index 314. If it is determined that there is not a matching hash value, then, in a step 414, the determined hash value may be stored in the hash index, and self-compression may be performed on the received data unit, and the self-compressed data unit may be stored, e.g., on the data store 320, which may include one or more physical devices 16*a-c*. The steps 406 and 414 may be implemented by the hash lookup logic 308.

If it is determined that there is a matching hash value, dictionary-based compression may be applied to the received data unit using the data unit corresponding to the matching hash value as a dictionary (i.e., base data unit) in a step 408. If during the dictionary-based compression it is determined that the two data units are identical (i.e., duplicates), in a step 412 a reference to the base data unit may be associated with the received data unit, rather than compressing the received data unit and storing it.

If the received data unit is not a duplicate of the base data unit, the dictionary-based compression may be completed and the compressed data unit stored in the step 418, e.g., on the data storage 320, which may include one or more physical devices 16*a-c*. In a step 420, information associating the received data unit and the base data unit may be recorded, e.g., on the data storage 320. The steps 408, 410, 412, 416, 418 and 420 may be implemented by the compression logic 312.

The information associating the received data unit and the base data unit may be used to de-compress the compressed received data unit, for example, in response to a read operation received from a host system. For example, in response to a read operation for a candidate data unit, the information associating the candidate data unit to its base data unit may be accessed, and the base data unit retrieved (and de-compressed if necessary) and then applied to the compressed candidate data unit to de-compress it.

FIG. 5 is a flow chart illustrating an example of the method 500 of determining a representative portion of a data unit to be hashed, according to embodiments of the invention. Other embodiments of a method of determining a portion of a data unit to be hashed, for example, variations of the method 500, are possible and are intended to fall within the scope of the invention. The method 500 may be implemented by the hash generation logic 304.

The representative portion of a data unit to be hashed may be comprised of a plurality of chunks of data of the data unit, where each chunk is a continuous, uninterrupted section of data. However, the chunks are not necessarily themselves contiguous to one another, although it is possible. In some embodiments, it is very unlikely that any two of the chunks of the set are contiguous to one another, for reasons that should be clear from the discussion herein. The chunks may be selected using a variation of MinHash.

In a step 502, a hash function, for example, a simple prime multiplication hash function, may be applied to chunks of the data unit. Other types of hash functions may be applied. In a step 504, a set of M max/min hash values may be determined, and locations within the data unit of the chunks corresponding to the min/max values may be determined and recorded. The steps 502 and 504 may be collectively implemented by performance of a method 600 described in relation to FIG. 6.

In a step 506, the representative portion may be created based on chunks corresponding to the set M of max/min values, for example, as described in relation to a method 800 described in relation to FIG. 8.

FIG. 6 is a flow chart illustrating an example of the method 600 of applying a hash function to chunks of a data unit to determine max/min hash values for the data unit, according to embodiments of the invention. Other embodiments of a method of applying a hash function to chunks of a data unit to determine max/min hash values for the data unit, for example, variations of the method 600, are possible and are intended to fall within the scope of the invention. The method 600 may be implemented by the hash generation logic 304.

In a step 601, the data unit (e.g., page, block, file) may be conceptually divided into S subsets of K data elements (e.g., bytes). For example, a 4 KB (4096 bytes) page of data may be conceptually divided into 512 (i.e., S=512) subsets of 8 (i.e., K=8) bytes. In a step 602, a subset variable, s, may be initialized to 0, and, in a step 604, a position variable, k, may be initialized to 0.

In a step 606, a hash value H[k] may be determined for a chunk of consecutive data elements corresponding to the position k within the subset s. This will now be illustrated with reference to FIG. 7, which will be referenced throughout the description of the method 600.

Figure 7:
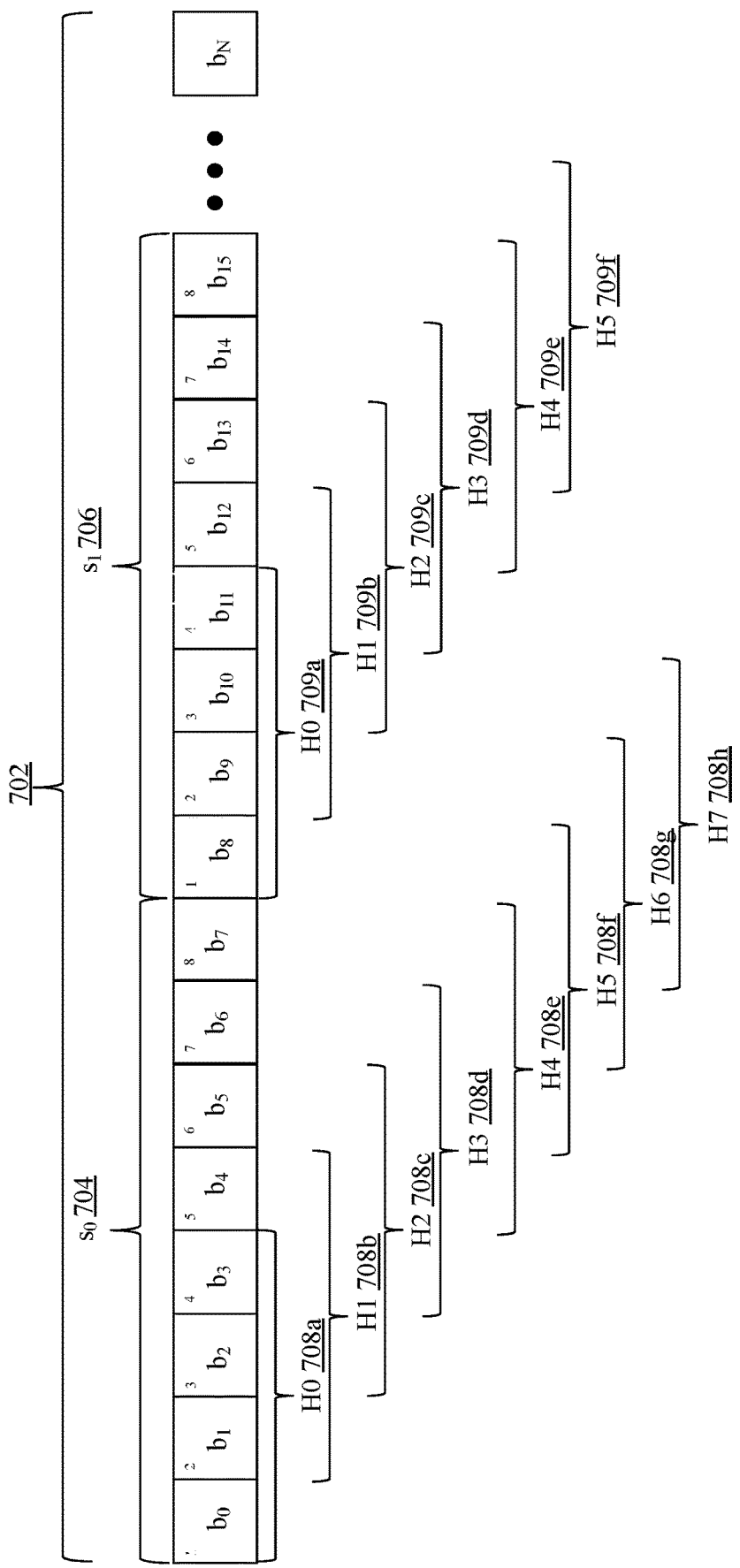
FIG. 7 is a block diagram illustrating an example of a data unit having a hash function applied to chunks of the data unit to determine max/min hash values for the data unit.

FIG. 7 is a block diagram illustrating an example of a data unit 702 having a hash function applied to chunks of the data unit to determine max/min hash values for the data unit, according to embodiments of the invention. Other embodiments of a data unit having a hash function applied to chunks of the data unit to determine max/min hash values for the data unit are possible and are intended to fall within the scope of the invention. The data unit 702 includes a plurality of data elements, $b_0$-$b_N$, which may be conceptually divided into S subsets, including subset $s_0$ and $s_1$. Each data element has a position k within its respective subset, which is reflected by the number in the upper left corner of each data element. For example, in some embodiments, N=4096, S=512 and K=8.

The step 606 of the method 600 may apply a hash function to the chunk of four data elements b0-b3 corresponding to data element $b_0$ at position k=0 of the subset $s_0$ to calculate a hash value H0 708a. The hash function may be, for example, a simple prime multiplication hash function or another type of hash function. It should be appreciated that, while in the example of FIG. 7 a chunk is comprised of four data elements, the invention is not so limited, as a chunk may be comprised of more or less that four data elements.

In a step 608, the maximum value calculated for position k in any if the subsets thus far may be determined; i.e., maxH[k]=max(H[k], maxH[k]). For the first subset $s_0$ 704, maxH[k]=H[k]. For example, with reference to FIG. 7, it may be determined that maxH0=H0 708a. For future passes through the steps 606-608 for later subsets within the data unit, for example, subset $s_1$ 706, the value of maxH[k] for k=0 may change depending on the calculated value of H0 (e.g., H0 709a) for the future subsets. While embodiments of the method 600 described herein determine maximum hash values for each position, it should be appreciated that the invention is not so limited. In some embodiments, minimum hash values are determined instead of maximum hash values.

In a step 610, the location within the data unit corresponding to the maximum value for position k may be recorded. That is, maxlocH[k] may be recorded. For example, the position may be specified by an LBA offset within the data unit. With reference to FIG. 7, for a first pass through the steps 606-610, i.e., for $s_0$ 704, an LBA offset=0 may be specified for b0.

In a step 612, it may be determined whether the last position within a subset has been reached, e.g., whether k=K-1. That is, if K=8 and k=0 is the first position, then k=7 (i.e., K-1) is the last position. If the last position within the subset has not been reached, the position variable k may be incremented by 1 in a step 614, and the method 600 may return to the step 606 and perform the steps 606-610 for the next position within the current subset. For example, referring to FIG. 7, for subset $s_0$ 704, a second pass through the steps 606-610 (when k=1) may: calculate H1 708b for the chunk of data elements $b_1$-$b_4$ corresponding to data element $b_1$; determine that maxH1=H1 708b; and determine an LBA offset of one byte for $b_1$. For future passes through the steps 606-608 for later subsets within the data unit, for example, subset $s_1$ 706, the value of maxH[k] for k=1 may change depending on the calculated value of H1 (e.g., H1 709b) for the future subsets; and the location maxlocH1 may be updated accordingly.

The steps 606-610 may be repeated K times for a given subset. For example, if K=8, performance of the steps 606-610 may produce H0-H7 for a given subset. Referring to FIG. 7, performance of the steps 606-610 for $s_0$ 704 may produce H0 708a, H1 708b, H2 708c, H3 708d, H4 708e, H5 708f, H6 708g and H7 708h. As this is the first subset of data unit 702: maxH0=H0 708a, maxH1=H1 708b, maxH2=H2 708c, maxH3=H3 708d, maxH4=H4 708e, maxH5=H5 708f, maxH6=H6 708g and maxH7=H7 708h.

After the steps 606-610 have been repeated K times, the step 612 will determine that the current position k is the last position within the subset, and the method 600 will proceed to the step 616, where it will be determined whether the current subset is the last subset of the data unit; i.e., whether s=S-1. For example, if S=512 and s=0 is the first subset, then s=511 (i.e., S-1) is the last subset.

If it is determined in the step 616 that the current subset is not the last subset, then the subset variable may be incremented by 1 in a step 618 and the method 600 may return to the step 604, where the position variable may be initialized to 0, and the steps 606-610 may be performed for the new current subset. For example, referring to FIG. 7, if s=1 and k=0, the step 606 may be performed for the data element $b_8$ of the subset $s_1$ 706, which may produce H0 709a.

In the step 608, the maximum value calculated for position k=0 in any if the subsets thus far (e.g., $s_0$ and $s_1$) may be determined; e.g., maxH0=max(H0 709a, maxH0), and the corresponding location maxlocH0 recoded in the step 610.

The steps 606-610 may be repeated K=8 times for the subset s1 706, which may produce H0 709a, H1 709b, H2 709c, H3 709d, H4 709e, H5 709f, H6 (not shown) and H7 (not shown). The values of maxHx, and maxlocHx will depend on the relative values of Hx calculated for the first two subsets $s_0$ 704 and $s_1$ 706.

After the steps 606-610 have been repeated K times for s=1, the step 612 will determine that the current position k is the last position within the subset, and the method 600 will proceed to the step 616, where it may be determined whether the current subset is the last subset of the data unit. The loop defined by the steps 604-616 may be performed S times; i.e, for each subset, until all subsets of the data unit have been processed. For the example of FIG. 7 when N=4096, S=512 and K=8, if it is determined in the step 616 that the subset is the last subset, i.e., S=511, then the method 600 may end.

At the end of the performance of the method 600, there may be two vectors, a vector of maxH values, maxH[0:K-1], and a corresponding vector of maxlocH values, maxlocH [0:K-1]. For example, if K=8, then maxH[0:7]=[maxH0, maxH1, maxH2, maxH3, maxH4, maxH5, maxH6, maxH7] and maxlocH [0:7]=[maxlocH0, maxlocH1, maxlocH2, maxlocH3, maxlocH4, maxlocH5, maxlocH6, maxlocH7]. These vectors may be used to create a representative portion of a data unit, for example, using the method 800 described in relation to FIG. 8.

It should be appreciated that, in some embodiments described in more detail elsewhere herein, the maximum hash values determined in the step 608 are not used as part of the hash value ultimately generated for the data unit and compared against hash values generated from other data units. Rather, the locations of the data chunks that resulted in the maximum hash values are used to construct the representative data portion, for which a hash value for the data unit is generated, as described in more detail elsewhere herein.

FIG. 8 is a flow chart illustrating an example of a method 800 of creating a representative portion of a data unit to be hashed from chunks of the data unit, according to embodiments of the invention. Other embodiments of a method of creating a portion of a data unit to be hashed from chunks of the data unit, for example, variations of the method 800, are possible and are intended to fall within the scope of the invention. The method 800 may be implemented by the hash generation logic 304.

In a step 801, a number, M, of unique maximum values of the maxH[0:K-1] vector may be chosen, where M<K. For example, M may be the desired number of max values from which to create the representative portion, but K>M maximum values may have been generated to avoid using duplicate max values when creating the representative portion. The value of M may be predefined based on a desired degree of similarity between data units for the data units to be deemed similar; i.e., to produce matching hash values from representative portions. The larger the value of M, the greater the number of matching bits (corresponding to locations of determined maximum values) necessary between data units to produce matching hash values of representative portions of the data units so that they are deemed similar. Thus, a larger value of M will result in less matching hash values; i.e., less true positives and false positives, whereas a smaller value of M will result in more true positives and false positives. In some embodiments, the M unique maximum values having the highest values may be selected from the K maximum values.

In a step 802, the M maximum values may be sorted according to the location within the data unit of the chunks of data elements from which the respective maximum values were generated, producing a vector maxH[0:M-1] and a vector maxlocH[0:M-1]. In a step 804, a vector position variable, m, may be initialized to 0.

In a step 806, the chunk of data elements corresponding to the maximum value at position m in the maxH[0:M-1] vector may be obtained—i.e., accessed from a memory location for the position m specified in the maxlocH[0:M-1] vector.

In a step 808, for the chunk for position m, contiguous pieces (i.e., chunks) of data from immediately before and/or immediately after the chunk in the data unit (e.g., neighboring bytes) may be concatenated to the beginning and end, respectively, of the chunk to produce an extended chunk. In some embodiments, the original chunk is 4 bytes in length, and the contiguous pieces from immediately before and immediately after the chunk are each 4 bytes in length, producing an extended chunk having a length of 12 bytes.

Adding contiguous pieces that were not involved in generating the maximum hash value may reduce an amount of false positives when determining matches between hash values of representative portions of data units (e.g., the step 406). For example, in embodiments in which the step 606 is generating hash values of relatively small chunks of data (e.g., 4 bytes), it is possible that two data units may generate the same maximum hash values, but not actually be that similar (to the degree similarity is defined). Thus, to decrease the likelihood that the representative portions generated for two data units produce the same hash value when they are not that similar (despite small chunks producing the same maximum hash values), the contiguous pieces may be added on either end of the chunks to produce the extended chunks. If the two data units are truly similar, the hash values produced from representative portions created from the extended chunks should still be the same. However, if the two data units are not truly similar, it is less likely that the hash values produced from representative portions created from the extended chunks will be the same.

In a step 810, the extended chunk may be appended to the representative portion. For the extended chunk for a first position m=0, the representative portion is initialized to the value of the extended chunk.

In a step 812, it may be determined whether the current position, m, is the last position in maxH[0:M-1]. If not, the vector position variable may be incremented, and the method 800 may return to the step 806, and repeat the steps 806-810 for the next position in maxH[0:M-1]. If it is determined in the step 812 that the current position, m, is the last position in maxH[0:M-1], method 800 may end.

In some embodiments, the chunks of data may be obtained from the data unit (and contiguous pieces added thereto) in any order, and then arranged in order according to their previous locations (e.g., LBA) within the data unit from which they were obtained to produce the representative portion. In some embodiments, rather than being arranged accordingly to location within the data unit, the chunks of data (and contiguous pieces added thereto) are arranged according to value (e.g., highest to lowest or vice versa) to form the representative portion.

At the completion of the method 800, the representative portion has been created. If M=5 and the extended chunks are 12 bytes in length, the representative portion may be 60 bytes in length. A hash value may be generated for the representative portion as described in more detail elsewhere herein. For example, the steps 404-420 of the method 400 may be performed for the representative portion. In embodiments for which the data unit is 4096 bytes in length, rather than generating a hash value for 4096 bytes, a hash value may be generated for a representative portion of the data unit that is only 60 bytes in length.

Some embodiments of the invention may be considered a variation of MinHash. Whereas some embodiments of MinHash generate separate hash values for every data element (e.g., byte) of a data unit (e.g., page), embodiments of the invention described herein may not generate a hash value for individual data elements, but rather for chunks of data elements, although the invention is not so limited. In some embodiments, hash values may be generated for individual data elements. Further, whereas some embodiments of MinHash generate multiple hash values for every piece of data for which a hash value is generated, embodiments of the invention described herein may not generate multiple hash values for every piece of data for which a hash value is generated, but rather generate only a single hash value for each such piece (e.g., chunk), although the invention is not so limited. In some embodiments, multiple hash values may be generated for each chunk. Generating only a single hash value for each chunk may reduce computational overhead, conserving computation resources.

It should be appreciated that various parameters of the system 300 and the method 400, 500, 600 and 800 may be modified to achieve desired similarity deduplication properties, including, but not limited to, K, S, M, N, size of data elements, and number of data elements in a chunk.

Various embodiments of the invention may be combined with each other in appropriate combinations. Additionally, in some instances, the order of steps in the flowcharts, flow diagrams and/or described flow processing may be modified, where appropriate. It should be appreciated that any of the methods described herein, including methods 400, 500, 600 and 800, or parts thereof, may be implemented using one or more of the systems and/or data structures described in relation to FIGS. 1-3 and 7, or components thereof. Further, various aspects of the invention may be implemented using software, firmware, hardware, any suitable combination thereof and/or other computer-implemented modules or devices having the described features and performing the described functions. Logic that when executed performs methods described herein, steps thereof or portions of such methods or steps, may be implemented as software, firmware, hardware, or any suitable combination thereof.

Software implementations of embodiments of the invention may include executable code that is stored on one or more computer-readable media and executed by one or more processors. Each of the computer-readable media may be non-transitory and include a computer hard drive, ROM, RAM, flash memory, portable computer storage media such as a CD-ROM, a DVD-ROM, a flash drive, an SD card and/or other drive with, for example, a universal serial bus (USB) interface, and/or any other appropriate tangible or non-transitory computer-readable medium or computer memory on which executable code may be stored and executed by a processor. Embodiments of the invention may be used in connection with any appropriate OS.

As used herein, an element or operation recited in the singular and preceded with the word "a" or "an" should be understood as not excluding plural elements or operations, unless such exclusion is explicitly recited. References to "one" embodiment or implementation of the present disclosure are not intended to be interpreted as excluding the existence of additional embodiments that also incorporate the recited features. Furthermore, a description or recitation in the general form of "at least one of [a], [b] or [c]," or equivalent thereof, should be generally construed to include [a] alone, [b] alone, [c] alone, or any combination of [a], [b] and [c]. In addition, use of a an ordinal term, e.g., "first," "second" or the like, to qualify a term for an item having multiple instances of the same name does not necessarily indicate a priority, precedence or temporal order between the instances unless otherwise indicated, but rather such ordinal terms may be used merely to distinguish between the separate instances.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. For a data storage system having a plurality of physical storage devices on which data units are stored, a method comprising:
    applying a first hash function to a first data unit to produce a first hash value of a first data unit;
    determining that the first hash value of the first data unit has a same hash value as any of one or more other data units;
    responsive to said determining that the first hash value of the first data unit has the same hash value as a second data unit of the one or more other data units, performing dictionary-based compression of the first data unit using the second data unit as a dictionary;
    determining, during said dictionary-based compression of the first data unit using the second data unit as a dictionary, that the first data unit and the second data unit are not identical; and
    responsive to said determining, during said dictionary-based compression of the first data unit using the second data unit as a dictionary, that the first data unit and the second data unit are not identical, storing, on one or more of the plurality of physical storage devices, a compressed data unit which is a compressed form of the first data unit produced by said dictionary-based compression using the second data unit as a dictionary.

2. The method of claim 1, wherein the first hash function is applied to only a portion of the first data unit to produce the first hash value.

3. The method of claim 2, further comprising:
    applying a second hash function to a plurality of chunks of the first data unit to produce, for each of the plurality of chunks, a third hash value;
    determining a plurality of maximum values or minimum values from among the third hash values; and
    forming the portion of the first data unit from at least a subset of the chunks that produced the maximum values or minimum values.

4. The method of claim 3, further comprising:
    for each chunk of the subset of chunks, appending other contiguous pieces of data from before and/or after the chunk within the data unit to the chunk to produce an extended chunk, wherein the portion of the data is formed from the extended chunks.

5. The method of claim 3, further comprising:
    recording a relative position within the first data unit of each chunk that produced one of the plurality of maximum or minimum values; and
    for the at least subset of chunks, obtaining the chunk from the recorded relative position of the chunk.

6. The method of claim 5, further comprising:
    ordering the at least subset of chunks according to the relative positions of the chunks within the first data unit,
    wherein forming the portion includes concatenating the chunks according to the ordering.

7. The method of claim 1, wherein the method further comprises:
applying the first hash function to a candidate data unit to produce a third hash value of the candidate data unit;
determining that the third hash value does not match an existing hash value of any of the one or more other data units; and
responsive to determining that the third hash value does not match the existing hash value of any of the one or more other data units, compressing the candidate data unit using self-compression, and storing the third hash value in a hash index.

8. A data storage system comprising:
a plurality of physical storage devices on which data units are stored; and
one or more memories comprising code stored thereon that, when executed, performs a method including:
applying a first hash function to a first data unit to produce a first hash value of a first data unit;
determining that the first hash value of the first data unit has a same hash value as any of one or more other data units;
responsive to said determining that the first hash value of the first data unit has the same hash value as a second data unit of the one or more other data units, performing dictionary-based compression of the first data unit using the second data unit as a dictionary;
determining, during said dictionary-based compression of the first data unit using the second data unit as a dictionary, that the first data unit and the second data unit are not identical; and
responsive to said determining, during said dictionary-based compression of the first data unit using the second data unit as a dictionary, that the first data unit and the second data unit are not identical, storing, on one or more of the plurality of physical storage devices, a compressed data unit which is a compressed form of the first data unit produced by said dictionary-based compression using the second data unit as a dictionary.

9. The data storage system of claim 8, wherein the first hash function is applied to only a portion of the first data unit to produce the first hash value.

10. The data storage system of claim 9, wherein the method further includes:
applying a second hash function to a plurality of chunks of the first data unit to produce, for each of the plurality of chunks, a third hash value;
determining a plurality of maximum values or minimum values from among the third hash values; and
forming the portion of the first data unit from at least a subset of the chunks that produced the maximum values or minimum values.

11. The data storage system of claim 10, wherein the method further includes:
for each chunk of the subset of chunks, appending other contiguous pieces of data from before and/or after the chunk within the data unit to the chunk to produce an extended chunk,
wherein the portion of the data is formed from the extended chunks.

12. The data storage system of claim 10, wherein the method further includes:
recording a relative position within the first data unit of each chunk that produced one of the plurality of maximum or minimum values; and
for the at least subset of chunks, obtaining the chunk from the recorded relative position of the chunk.

13. The data storage system of claim 12, wherein the method further includes:
ordering the at least subset of chunks according to the relative positions of the chunks within the first data unit,
wherein forming the portion includes concatenating the chunks according to the ordering.

14. The data storage system of claim 8, wherein the method further comprises:
applying the first hash function to a candidate data unit to produce a third hash value of the candidate data unit;
determining that the third hash value does not match an existing hash value of any of the one or more other data units; and
responsive to determining that the third hash value does not match the existing hash value of any of the one or more other data units, compressing the candidate data unit using self-compression, and storing the third hash value in a hash index.

15. For a data storage system having a plurality of physical storage devices on which data units are stored, non-transitory computer-readable media having code stored thereon that, when executed, performs a method comprising:
applying a first hash function to a first data unit to produce a first hash value of a first data unit;
determining that the first hash value of the first data unit has a same hash value as any of one or more other data units;
responsive to said determining that the first hash value of the first data unit has the same hash value as a second data unit of the one or more other data units, performing dictionary-based compression of the first data unit using the second data unit as a dictionary,
determining, during said dictionary-based compression of the first data unit using the second data unit as a dictionary, that the first data unit and the second data unit are not identical; and
responsive to said determining, during said dictionary-based compression of the first data unit using the second data unit as a dictionary, that the first data unit and the second data unit are not identical, storing, on one or more of the plurality of physical storage devices, a compressed data unit which is a compressed form of the first data unit produced by said dictionary-based compression using the second data unit as a dictionary.

16. The non-transitory computer-readable media of claim 15, wherein the first hash function is applied to only a portion of the first data unit to produce the first hash value.

17. The non-transitory computer-readable media of claim 16, wherein the method further comprises:
applying a second hash function to a plurality of chunks of the first data unit to produce, for each of the plurality of chunks, a third hash value;
determining a plurality of maximum values or minimum values from among the third hash values; and
forming the portion of the first data unit from at least a subset of the chunks that produced the maximum values or minimum values.

18. The non-transitory computer-readable media of claim 17, wherein the method further comprises:
for each chunk of the subset of chunks, appending other contiguous pieces of data from before and/or after the chunk within the data unit to the chunk to produce an extended chunk, wherein the portion of the data is formed from the extended chunks.

19. The non-transitory computer-readable media of claim 18, wherein the method further comprises:

recording a relative position within the first data unit of each chunk that produced one of the plurality of maximum or minimum values; and for the at least subset of chunks, obtains the chunk from the recorded relative position of the chunk.

20. The non-transitory computer-readable media of claim 15, wherein the method further comprises:

applying the first hash function to a candidate data unit to produce a third hash value of the candidate data unit;

determining that the third hash value does not match an existing hash value of any of the one or more other data units; and responsive to determining that the third hash value does not match the existing hash value of any of the one or more other data units, compressing the candidate data unit using self-compression, and storing the first third hash value in a hash index.

21. The method of claim 1, further comprising:

applying the first hash function to a candidate data unit to produce a third hash value of the candidate data unit;

determining that the third hash value of the candidate data unit matches one hash value of a corresponding data unit of the one or more other data units;

responsive to said determining that the third hash value of the candidate data unit matches said one hash value of the corresponding data unit, performing said dictionary-based compression of the candidate data unit using the corresponding data unit as a dictionary;

determining, during said dictionary-based compression of the candidate data unit using the corresponding data unit as a dictionary, that the candidate data unit and the corresponding data unit are identical; and responsive to said determining, during said dictionary-based compression of the candidate data unit using the corresponding data unit as a dictionary, that the candidate data unit and the corresponding data unit are identical, storing, on one or more of the plurality of physical storage devices, a reference to the corresponding candidate data unit as the candidate data unit.

* * * * *

UNITED STATES PATENT AND TRADEMARK OFFICE
CERTIFICATE OF CORRECTION

PATENT NO. : 11,615,063 B2
APPLICATION NO. : 17/155224
DATED : March 28, 2023
INVENTOR(S) : Kabishcer et al.

It is certified that error appears in the above-identified patent and that said Letters Patent is hereby corrected as shown below:

In the Claims

Column 25, Line 16:
In Claim 20, the phrase "and storing the first third" should read -- and storing the third --

Signed and Sealed this
Nineteenth Day of September, 2023

Katherine Kelly Vidal
*Director of the United States Patent and Trademark Office*